(12) United States Patent
Yoneda

(10) Patent No.: US 6,385,072 B1
(45) Date of Patent: May 7, 2002

(54) CONTENT ADDRESSABLE MEMORY USING PART OF MEMORY REGION TO STORE DATA WHICH SHOULD NOT BE ERASED

(75) Inventor: Masato Yoneda, Chiba (JP)

(73) Assignee: Kawasaki Microelectronics, Inc., Mihama-ku (JP)

(*) Notice: Subject to any disclaimer, the term of this patent is extended or adjusted under 35 U.S.C. 154(b) by 0 days.

(21) Appl. No.: 09/916,676

(22) Filed: Jul. 30, 2001

(30) Foreign Application Priority Data

Aug. 1, 2000 (JP) ........................................ 2000-233387

(51) Int. Cl.[7] .............................................. G11C 15/00
(52) U.S. Cl. ......................................... 365/49; 711/108
(58) Field of Search ............................. 365/49; 711/108

(56) References Cited

U.S. PATENT DOCUMENTS

| | | | | |
|---|---|---|---|---|
| 5,325,507 A | * | 6/1994 | Freitas et al. | 365/49 |
| 5,438,535 A | * | 8/1995 | Lattibeaudiere | 365/49 |
| 5,479,366 A | * | 12/1995 | Sasama | 365/49 |
| 5,802,586 A | * | 9/1998 | Jones et al. | 365/49 |
| 5,946,704 A | * | 8/1999 | Yoneda et al. | 365/49 |

* cited by examiner

Primary Examiner—Trong Phan
(74) Attorney, Agent, or Firm—Oliff & Berridge PLC

(57) ABSTRACT

A content addressable memory (CAM) includes a memory region containing a plurality of word memories, an address storage section for storing address data specifying a partial region of the memory region, and overwriting means for overwriting the contents of word memories in a region in the memory region excluding the partial region. The overwriting means performs retrieval to the memory region by using predetermined data as retrieval data in response to a predetermined command, and performs overwriting for the contents of word memories that contain storage data corresponding to the predetermined data used for the retrieval and that exist in a region in the memory region excluding the partial region. Data which should not be erased is stored in the partial region of the memory region, and erase-target data is stored in the memory region excluding the partial region. Thereby, the necessity for increasing the memory capacity can be avoided to secure empty addresses in the memory region, and furthermore, control can be simplified.

20 Claims, 4 Drawing Sheets

| ADDRESS DATA | PORT NUMBER | TIME STAMP DATA |
|---|---|---|
| ADDRESS DATA | PORT NUMBER | TIME STAMP DATA |
| ⋮ | ⋮ | ⋮ |

CONTENT ADDRESSABLE MEMORY USING PART OF MEMORY REGION TO STORE DATA WHICH SHOULD NOT BE ERASED

BACKGROUND OF THE INVENTION

1. Field of the Invention

The present invention relates to a content addressable memory (CAM)(which is also generally called an "associative memory")

2. Description of the Related Art

Conventionally, a content addressable memory (CAM) is known as a memory used such that storage data is stored in each of a plurality of word memories (which constitute a memory region) to permit overwriting, retrieval data is entered, and storage data corresponding to the retrieval data is retrieved.

One of the major applications is a network frame repeater that relays communications of network frames. The network frame repeater will be outlined hereinbelow.

Conventionally, a network system includes a network frame repeater called, for example, a "hub". The network frame repeater relays transmission of network frames, each of which is a packet of information that is communicated in the network system.

FIG. 3 is a circuit block diagram showing an example configuration of a network frame repeater 30.

The network frame repeater 30 includes n pieces of port controllers 32_1 to 32_n connected to a bus 31. In addition, a plurality of terminals A, B, . . . , C and a plurality of terminals E, F, . . . , G are connected via local area networks 34_1 to 34_n (LANs) to ports 33_1 to 33_n, respectively, which correspond to the port controllers 32_1 to 32_n.

In addition, the bus 31 is connected to a CAM 35, a random access memory 36 (RAM), a central processing unit 37 (CPU), and a packet memory 38.

Compared to an ordinary RAM, the CAM 35, to which a retrieval function is added, is expensive in terms of the cost per bit and has a small memory capacity. To solve this problem, the network frame repeater 30 shown in FIG. 3 uses both the CAM 35 and the RAM 36. Data directly required for retrieval is stored in the CAM 35, and data not directly required for retrieval is stored in the RAM 36. The addresses of word memories of the CAM 35 are correlated to the addresses of memory regions of the RAM 36 via a signal line 39. The CAM 35 stores address data representing the addresses of the individual terminals and time stamp data (which will be described hereafter). On the other hand, the RAM 36 stores the port numbers of the individual ports 33_1 to 33_n connected to the terminals. In addition, the RAM 36 stores other data, such as data related to a virtual LAN (VLAN), and data accessed by hardware of the network frame repeater 30 (detailed description of the data is omitted herefrom).

The CPU 37 performs the overall control of the network frame repeater 30. The packet memory 38 temporarily stores received network frames.

Ordinarily, the network frame repeater 30 includes various other devices. However, since the devices are not directly concerned with the intended subject matter, they are neither described nor illustrated.

Hereinbelow, description will be made with reference to an example case where information in the form of a network frames is transmitted from the terminal B connected to the LAN 34_1 to the terminal E connected to the LAN 34_n.

A header portion of the network frame contains data identifying a destination address representing the terminal E, and a transmission source address representing the terminal B.

The network frame transmitted from terminal B via the port 33_1 is controlled to pass through the port controller 32_1 and the bus 31, and is then temporarily stored in the packet memory 38. The CPU 37 extracts the destination address representing a data transmission destination (terminal E in the example case) from the header portion of the network frame, and then sends it to the CAM 35. The CAM 35 contains address data representing the individual terminals A, B, . . . , C and the individual terminals E, F, . . . , G, which constitute the network system. On the other hand, the RAM 36 stores the port numbers individually identifying destinations to which the terminals A, B, . . . , C and the terminals E, F, . . . , G are connected via the ports 33_1 to 33_n. Address data representing the destination address is input into the CAM 35. Subsequently, the CAM 35 outputs to the signal line 39 an HHA (highest hit address) of a word memory of the CAM 35, which contains address data identical to the aforementioned input address data. In response to the output, the port number representing the destination terminal indicated by the destination address is read out of the address corresponding to the HHA of the RAM 36. Based on the port number that has been read out, the CPU 37 recognizes the present network frame as data that is due to be transmitted to port 33_n.

When the port number is read out of the RAM 36 in the above-described manner, the network frame is input from the packet memory 38 via the bus 31 to the port controller 32_n, and is further sent to the terminal E via the port 33_n and the LAN 34_n.

In this way, the network frame repeater 30 uses CAM 35 for performing high-speed retrieval of addresses.

FIG. 4 shows a MAC (media access control) table in the network frame repeater 30 shown in FIG. 3.

The MAC table shown in FIG. 4 contains address data representing the addresses (MAC addresses) of the terminals A, B, . . . , C and terminals E, F, . . . , G; the corresponding port numbers; and the corresponding time stamp data.

As described above, a destination address extracted from a network frame is used for retrieval. The port number to which the network frame is to be transmitted can be known from a retrieved address stored in the RAM 36, which corresponds to the HHA. As shown in FIG. 4, in addition to terminal address data, each of the word memories also contains time stamp data. Hereinbelow, the time stamp data will be described.

FIG. 5 is a view for explaining time stamp data.

As shown in FIG. 5, a predetermined time interval is set for one time slot, and p pieces of the time slots are cycled one by one as time passes. To discriminate the p pieces of the time slots from each other, their numbers, for example, numerals 1, 2, . . . , and p are assigned to represent the time stamp data T1, T2, . . . , and Tp, respectively.

In the CAM 35, in an event where a retrieval has been carried out by using a source address extracted from a network frame, the retrieval has detected an address identical to the source address thereof, time stamp data of the corresponding word memory is overwritten with the time stamp data that represents the time slot at that time (current time). However, in an event where the retrieval has not detected an address identical to the source address, data of the source address and time stamp data representing a time slot of the current time is written into a empty address field (empty word memory). On the other hand, into the RAM 36 are written the port number of a port from which a network frame having that source address has been transmitted. In the CAM 35, at each time interval that defines each of the time slots, retrieval is carried out by using the time stamp data of the time slot (time slot whereat the longest time has passed) immediately preceding the current time slot. As a result, if time stamp data identical to the input time stamp data is detected, data in the corresponding word memory is erased. By erasing the address data of terminals that have not been involved in communication for a long time, a empty address field is secured in the CAM 35, thereby enabling the CAM 35 to store new data. In this case, the erasure of data means that, for example, one bit in the word memory is allocated as a bit (empty bit) that is used to determine the existence of data, and the bit is overwritten so as to be converted from logic representing a data-existence to logic representing a data-nonexistence. In addition, each of the word memories may have an empty flag as a flipflop that indicates whether valid data is stored or not in the word memory, and data can be erased by overwriting the flag.

In this way, in the CAM 35, retrieval is performed for a time stamp data that the longest time has passed after set, and data regarding a terminal that has not been involved in communication is thereby erased. However, in a configuration where, for example, a server is connected as a terminal to the network frame repeater 30, a request is usually made for not erasing data regarding the server even when the server is not involved in communication for a long time. To comply with the request, a technique has been proposed. According to the proposed technique, the permanent bit corresponding to the address data of each terminal is registered in a MAC table as shown in FIG. 4, in which, when a permanent bit corresponding to data which should not be erased is set, the address data is not erased. However, the technique requires the permanent bit to be provided for each piece of terminal address data, thereby requiring an increased memory bit capacity.

According to another proposed technique, data which should not be erased among data registered in a MAC table is preliminarily saved, and the saved data is returned to the MAC table after retrieval. In this technique, however, every time a retrieval is performed by using time stamp data, read and write operations need to be performed with address data which should not be erased, thereby requiring a complicated control method.

SUMMARY OF THE INVENTION

In view of the above-described background, an object of the present invention is to provide a content addressable memory (CAM) that avoids the necessity for increasing the memory capacity and that simplifies control.

To achieve the above object, according to one aspect of the present invention, a content addressable memory of the present invention includes a memory region including a plurality of word memories, an address storage section for storing address data specifying a partial region of the memory region, and overwriting means for overwriting the contents of word memories in a region in the memory region excluding the partial region.

According to another aspect of the present invention, a content addressable memory includes a memory region including a plurality of word memories each including a predetermined plurality of bits, an address storage section for storing address data specifying a partial region of the memory region, and an overwriting means for performing retrieval by using predetermined data as retrieval data in response to a predetermined command and for overwriting the contents of word memories that contain storage data corresponding to the predetermined data used for the retrieval and that exist in a region in the memory region excluding the partial region.

According to still another aspect of the present invention, a content addressable memory is arranged such that storage data is stored in each of a plurality of word memories constituting a memory region so as to be overwritten, retrieval data is input, and storage data corresponding to the retrieval data that has been input is retrieved. The content addressable memory includes:

(1) an address storage section for storing address data specifying a partial region of the memory region; and (2) an aging means for performing retrieval by using predetermined time stamp data in response to a predetermined aging command and erasing the contents of word memories that contain storage data corresponding to the time stamp data used for the retrieval and that exist in a region in the memory region excluding the partial region.

In the content addressable memory of the present embodiment, even when a server and the like have not been involved in communication for a long time, relevant address data which should not be erased is stored in the partial region. On the other hand, terminal-related data to be erased by the aging means is stored in the region excluding the partial region. Specifically, according to the present invention, address data to be stored in the address storage section is used to specify the partial region in which the specific data which should not be erased is stored. Thereby, in the present embodiment, different from the conventional content addressable memory, to control specific address data not to be erased, there is no need to provide a permanent bit in individual address data nor is there a need to perform read and write operations for address data in a MAC table every time retrieval is performed. Consequently, the necessity for increasing memory capacity can be avoided, and furthermore, control can be simplified.

DESCRIPTION OF THE PREFERRED EMBODIMENTS

Hereinbelow, an embodiment of the present invention will be described.

Figure 1:
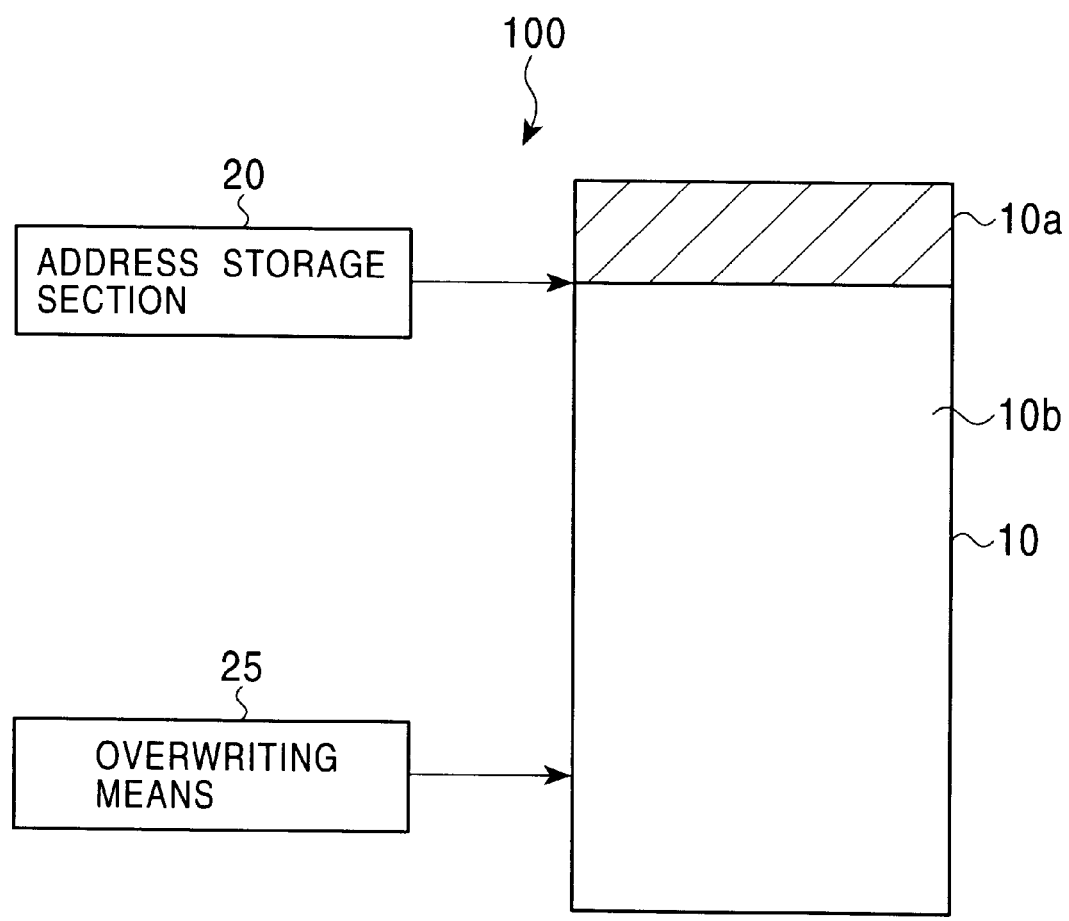
FIG. 1 is a schematic view of a content addressable memory according to an embodiment of the present invention.

FIG. 1 is a schematic view of a content addressable memory 100 (CAM) according to an embodiment of the present invention.

Figure 3:
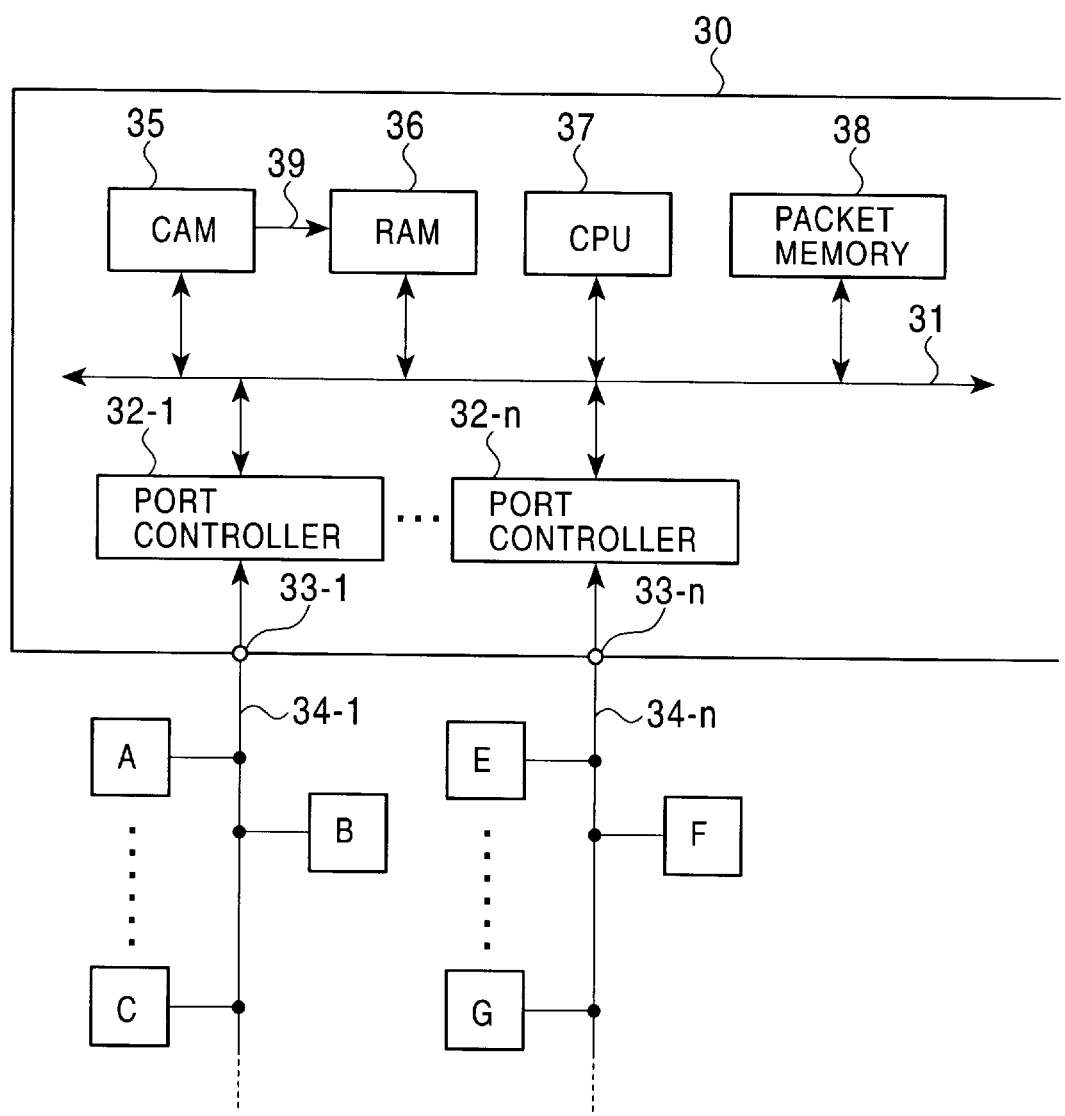
FIG. 3 is a circuit block diagram showing an example configuration of a network frame repeater.
Figures 4, 5:
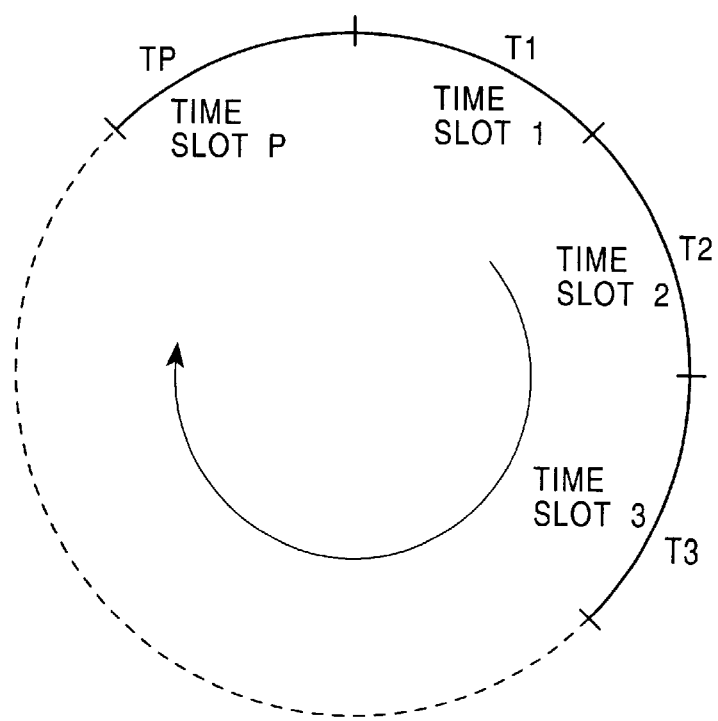
FIG. 4 shows a MAC table in the network frame repeater shown in FIG. 3.
FIG. 5 is a view for explaining time stamp data.

A description is made with reference to an example configuration in which the CAM 100 is built in the repeater 30 shown in FIG. 3.

The CAM 100 shown in FIG. 1 includes a memory region 10, a permanent-region pointer register 20 (an example of an address storage section according to the present invention) and an overwriting means 25 (or, erasing means).

The memory region 10 includes a plurality of word memories. Each of the word memories stores address data of each terminal, and time stamp data. The data stored therein can be overwritten. The memory region 10 includes two divisional regions. One of the regions is a permanent region 10a (which corresponds to a partial region according to the present invention), and the other region is a temporary region 10b. The permanent region 10a stores data of terminals (servers) that indicates permanent MAC addresses, that is, data that is not erased even when the terminals are not involved in communication for a long time (for example, two to five minutes). On the other hand, the temporary region 10b stores data regarding terminals, which is erased when the terminals are not involved in communication for a long time.

The permanent-region pointer register 20 stores a desired address that determines the size of the permanent region 10a, that is, address data representing a last address of the permanent region 10a. Thus, the permanent region 10a having addresses ranging from the first address to the desired address are set in the memory region 10.

The CAM 100 receives an aging command (which is also generally called a "table maintenance command") from the CPU 37 provided in the repeater 30 (refer to FIG. 3), and performs retrieval by using predetermined time stamp data as retrieval data. In addition, according to a procedure described below, the CAM 100 erases data in word memories that contain detected time stamp data identical to the time stamp data used for the retrieval and that belongs to the temporary region 10b of the memory region 10 excluding permanent region 10a. Then, the CAM 100 outputs a completion command to the CPU 37. The data is erased in the following method. A bit at a predetermined portion of a word memory is used as a tag representing whether or not valid data is stored in the word memory. The above-described overwriting means 25 performs overwriting for the bit at the predetermined portion of the word memory so as to be converted from logic representing that valid data is stored to logic representing that no data is stored. Thereby, data stored in the word memory can be erased.

Alternatively, the data may be erased in the following method. An empty flag is provided as a flipflop in each of the word memories. The flipflop indicates whether valid data is stored in the word memory. The data is erased by overwriting the flag.

Figure 2:
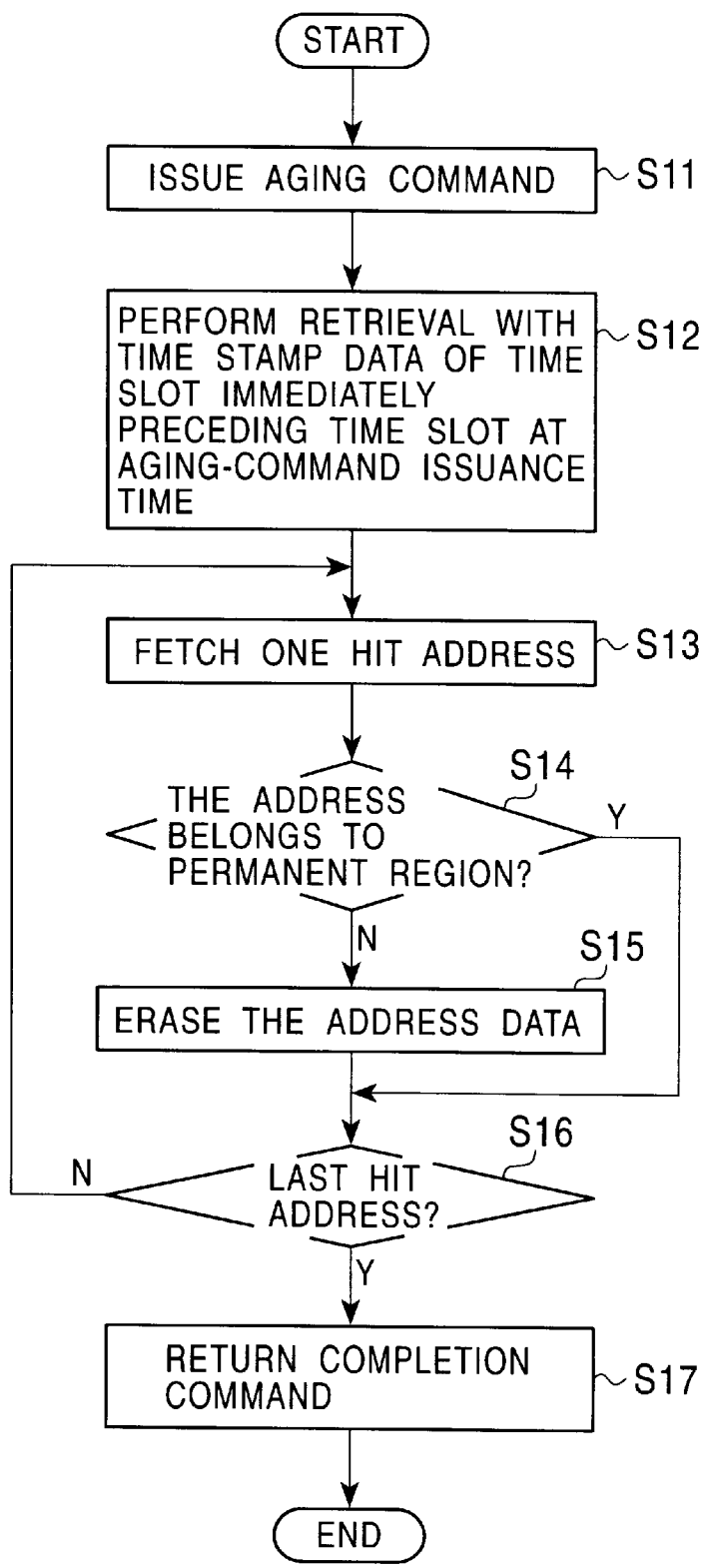
FIG. 2 is flowchart showing a routine of the operations ranging from the issuance of an aging command up to termination in the content addressable memory.

FIG. 2 is flowchart showing a routine of the operations ranging from the issuance of an aging command up to termination in the content addressable memory.

At step S11, an aging command is issued from the CPU 37 (shown in FIG. 3) to the CAM 100. In response to the aging command, in step S12, the CAM 100 starts the retrieval of data from the memory region 10 by using time stamp data of the time slot (time slot whereat the longest time has passed) immediately preceding a time slot at the time when the aging command has been issued. In this case, an assumption is made such that the retrieval operation has detected a plurality of hit addresses of word memories that have time stamp data identical to the time stamp data used for the retrieval. At step S13, one of the hit addresses is fetched, and the routine proceeds to step S14. At step S14, a determination is made whether or not the fetched hit address belongs to the permanent region 10a. If the hit address is determined not to belong to the permanent region 10a, since it belongs to the temporary region 10b, the routine proceeds to step S15. At step S15, data stored in the word memory corresponding to the address is erased, and the routine proceeds to step S16. On the other hand, at step S14, if the hit address is determined to belong to the permanent region 10a, since data stored in the word memory corresponding to the address need not be erased, the routine proceeds to step S16.

At step S16, a determination is made as to whether the hit address is a last address. If the hit address is determined to be the last hit address, the CAM 100 returns a completion command to the CPU 37 at step S17, and terminates the routine. On the other hand, if the hit address is determined not to be the last hit address, the operation returns to step S13. In this manner, erasing processing is performed for the address data representing the hit address in the temporary region 10b of the memory region 10 excluding the permanent region 10a.

As described above, in the CAM 100 of the present embodiment, data such as server address data which should not be erased is stored in the permanent region 10a of the memory region 10, which is specified by the permanent-region pointer register 20. On the other hand, address data to be erased by the overwriting means 30 is stored in the temporary region 10b of the memory region 10. Thereby, in the present embodiment, different from the conventional CAM, to control specific address data not to be erased, there is no need to provide a permanent bit in individual address data nor is there need to perform read and write operations for address data in the MAC table every time retrieval is performed. Consequently, the necessity for increasing the memory capacity can be avoided, and in addition, the control method can be simplified. For the overwriting means 30, data-overwriting circuits (such as a word-line encoder, word-line driver, and a write-in circuit) that are normally provided in a CAM are used as they are.

In the present embodiment, description has been made with reference to the example configuration where the address indicating the last address of the permanent region 10a is stored in the permanent-region pointer register 20 provided as the address storage section of the present invention, and thereby, the size of the permanent region 10a is determined to be programmable. However, the storage method of the present invention is not limited to that shown in the embodiment. For example, the address storage section of the present invention may be of a type that stores two addresses indicating the first address and the last address of the partial region of the memory region. Alternatively, the address storage section may be of a type that stores an address for fixedly setting the partial region of the memory region.

As described above, the present invention avoids the necessity for increasing the memory capacity, and furthermore, simplifies the control method.

What is claimed is:

1. A content addressable memory comprising:
    a memory region comprising a plurality of word memories;
    an address storage section for storing address data specifying a partial region of said memory region; and
    overwriting means for overwriting the contents of word memories in a region excluding said partial region in said memory region.

2. A content addressable memory as claimed in claim 1, wherein:
    a predetermined number of bits of said word memory is used as a tag indicating whether or not valid data is stored in said word memory; and said overwriting means overwrites said number of bits of said word memory to thereby erase data stored in said word memory.

3. A content addressable memory as claimed in claim 2, wherein said predetermined number of bits of said word memory is one predetermined bit at an arbitrary position in said word memory.

4. A content addressable memory as claimed in claim 3, wherein:

said partial region of said memory region is formed to start with the first address of said memory region; and said address storage section is a register for storing a last address of said partial region.

5. A content addressable memory as claimed in claim 3, wherein:

said partial region of said memory region is formed between two addresses, one of which has a value greater than that of the other one; and said address storage section comprises a register specifying a start address of said partial region and a register specifying an end address of said partial region.

6. A content addressable memory as claimed in claim 1, wherein:

each of said plurality of word memories comprises an empty flag indicating whether or not valid data is stored in the word memory; and said overwriting means overwrites said empty flag to thereby erase data stored in the word memory.

7. A content addressable memory comprising:

a memory region comprising a plurality of word memories each comprising a predetermined plurality of bits;

an address storage section for storing address data specifying a partial region of said memory region; and overwriting means for performing retrieval by using predetermined data as retrieval data in response to a predetermined command and for overwriting the contents of word memories that contain storage data corresponding to said predetermined data used for the retrieval and that exist in a region excluding said partial region in said memory region.

8. A content addressable memory as claimed in claim 7, wherein:

one predetermined bit at an arbitrary position in said word memory is used as a tag indicating whether or not valid data is stored in the word memory; and said overwriting means overwrites said one bit in the word memory to thereby erase data stored in the word memory.

9. A content addressable memory as claimed in claim 8, wherein:

said partial region of said memory region is formed to start with the first address of said memory region; and said address storage section is a register for storing a last address of said partial region.

10. A content addressable memory as claimed in claim 9, wherein:

said partial region of said memory region is formed between two addresses, one of which has a value greater than that of the other one; and said address storage section comprises a register specifying a start address of said partial region and a register specifying an end address of said partial region.

11. A content addressable memory as claimed in claim 7, wherein:

each of said plurality of word memories comprises an empty flag indicating whether or not valid data is stored in the word memory; and said overwriting means overwrites said empty flag to thereby erase data stored in the word memory.

12. A content addressable memory, wherein storage data is stored in each of a plurality of word memories forming a memory region so as to be overwritten, retrieval data is input, and storage data corresponding to the retrieval data that has been input is retrieved, said content addressable memory comprising:

an address storage section for storing address data specifying a partial region of said memory region; and erasing means for performing retrieval by using predetermined data as retrieval data in response to a predetermined command and erasing the contents of word memories that contain storage data corresponding to said predetermined data used for the retrieval and that exist in a region excluding said partial region in said memory region.

13. A content addressable memory as claimed in claim 12, wherein:

one predetermined bit at an arbitrary position in the word memory is used as a tag indicating whether or not valid data is stored in said word memory; and said erasing means overwrites said one bit of said word memory to thereby erase data stored in said word memory.

14. A content addressable memory as claimed in claim 13, wherein said erasing means executes a routine comprising:

(i) a step of performing retrieval to said memory region by using said predetermined data as said retrieval data in response to said predetermined command;

(ii) a step of fetching one hit address of a word memory containing storage data corresponding to said predetermined data;

(iii) a step of determining whether or not the fetched hit address is an address belonging to said partial region;

(iv) a step of erasing the data of the address when the hit address is not the address belonging to said partial region, and passing control to a subsequent step (v) without erasing the data of the address when the hit address is the address belonging to said partial region;

(v) a step of determining whether or not the fetched hit address is the last address; and (vi) a step of returning control to said step (i) when the fetched address is not the last address, and terminating said routine when the fetched address is the last address.

15. A content addressable memory as claimed in claim 14, wherein:

said predetermined command is a so-called aging command or a so-called table maintenance command for erasing the contents of the word memory in which unnecessary data is stored from said memory region; and said predetermined data is time stamp data.

16. A content addressable memory as claimed in claim 13, wherein:

each of said plurality of word memories comprises an empty flag indicating whether or not valid data is stored in the word memory; and said overwriting means overwrites said empty flag to thereby erase data stored in the word memory.

17. A content addressable memory as claimed in claim 16, wherein said erasing means executes a routine comprising:
   (i) a step of performing retrieval to said memory region by using said predetermined data as retrieval data in response to predetermined command;
   (ii) a step of fetching one hit address of a word memory containing storage data corresponding to said predetermined data;
   (iii) a step of determining whether or not the fetched hit address is an address belonging to said partial region;
   (iv) a step of erasing the data of the address when the hit address is not the address belonging to said partial region, and passing control to a subsequent step (v) without erasing the data of the address when the hit address is the address belonging to said partial region;
   (v) a step of determining whether or not the fetched hit address is the last address; and
   (vi) a step of returning control to said step (i) when the fetched address is not the last address, and terminating said routine when the fetched address is the last address.

18. A content addressable memory as claimed in claim 17, wherein:
   said predetermined command is a so-called aging command or a so-called table maintenance command for erasing the contents of the word memory in which unnecessary data is stored from said memory region; and
   said predetermined data is time stamp data.

19. A content addressable memory as claimed in claim 13, wherein:
   said partial region of said memory region is formed to start with the first address of said memory region; and
   said address storage section is a register for storing the last address of said partial region.

20. A content addressable memory as claimed in claim 13, wherein:
   said partial region of said memory region is formed between two addresses, one of which has a value greater than that of the other one; and
   said address storage section comprises a register specifying a start address of said partial region and a register specifying an end address of said partial region.

* * * * *